(12) United States Patent
Nisbet

(10) Patent No.: US 7,215,137 B1
(45) Date of Patent: May 8, 2007

(54) CREATING VIRTUAL EXTENDER PLUGINS USING MGTS

(75) Inventor: Stuart A. Nisbet, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 187 days.

(21) Appl. No.: 10/956,235

(22) Filed: Sep. 30, 2004

(51) Int. Cl.
*H03K 19/173* (2006.01)
*G06F 13/00* (2006.01)

(52) U.S. Cl. .................... 326/38; 326/41; 710/300; 709/250

(58) Field of Classification Search ............ 326/38, 326/41
See application file for complete search history.

(56) References Cited

U.S. PATENT DOCUMENTS 6,976,102 B1 * 12/2005 Groen et al. ............... 710/72
2005/0021749 A1 * 1/2005 Donlin et al. ............. 709/225

OTHER PUBLICATIONS

U.S. Appl. No. 10/956,210, filed Sep. 30, 2004, Trimberger.

* cited by examiner

*Primary Examiner*—Vibol Tan
(74) *Attorney, Agent, or Firm*—Timothy W. Markison; Michael T. Wallace

(57) ABSTRACT

Creating virtual extender plugins using MGTs (Multi-Gigabit Transceivers). A virtual extender plugin allows a user seamlessly to bridge between various FPGAs (Filed Programmable Logic Arrays) when designing and implementing electronic devices. These bridges, provided by these virtual extender plugins, allow for efficient use of various untapped resources within a device. For example, a given FPGA may employ virtual extender plugin(s) to access and use various untapped (or relatively lightly tapped) functionality of other FPGAs. These virtual extender plugins may be implemented according to a relatively wide variety of applications allowing the tapping of unused resources such as memory, microprocessor peripherals, LUTs (Look Up Tables), IOs (Input/Output devices and/or ports), memory, and embedded microprocessor blocks. Practically speaking, these virtual extender plugins actually "plug in" to a standard or user-defined bus stream having a standardized/ known type of serialized format such that every type of virtual extender plugin uses that same serialized format.

38 Claims, 9 Drawing Sheets

FPGAs (each having a corresponding virtual extender plugin)

VBE (Virtual Bus Extender) functionality

Fig. 7 general view of virtual extender plugin layout virtual extender plugin timing diagram method for extending functionality of an FPGA

CREATING VIRTUAL EXTENDER PLUGINS USING MGTS

BACKGROUND OF THE INVENTION

1. Technical Field of the Invention

The invention relates generally to electronic devices; and, more particularly, it relates to interfacing of FPGAs (Filed Programmable Logic Arrays) within various electronic devices.

2. Description of Related Art

As is known in the art of designing and building various electronic devices, one of the difficult tasks presented is the efficient allocation of resources for use by any one or more functional blocks within a device. When even considering the various basic functionality of a microprocessor within a device, there seems always to be the various design challenges to ensure sufficient (yet efficient) amount of memory (including both on-chip and off-chip in some instances), sufficient peripheral support, sufficient amount of IOs (Input/ Output devices and/or ports), and so on. Once a designer decides on a particular implementation and the amounts of such processing and support allocation (e.g., amounts of memory, peripheral support, IOs, and so on), there is typically great inflexibility in changing those allocations for a particular device. Certainly, knowledge (either good or bad) may be acquired for a particular device, and that knowledge may be used to allow for a more efficient allocation of resources in a next-generation device. However, this does not help the present device to perform any more efficiently in terms of the allocation and usage of resources.

Within more complex devices that include a wider variety of functional blocks, some of these functional blocks may actually include an appropriate amount of support resources. However, as is oftentimes the case, a functional block includes too little support resources (e.g., memory, processing functionality, IOs, etc.) or there are many support resources that go unused. For example, one functional block in a device may be using all (e.g., to capacity) of the support resources provided there to. Another functional block in the same device may have a large amount of support resources available that are simply sitting idly and performing no functions whatsoever; or else, these support resources may be used on a relatively infrequent basis.

The static and one-time design of such prior art devices shows their inflexibility to accommodate changing needs or operating conditions in terms of their support resources. That is to say, once a design is made, the user simply needs to deal with the existent and dedicated support resources for the various functional blocks included within a device. While some support resources can be upgraded (e.g., memory), the vast majority of such support resources cannot be modified once the device is made (e.g., number of IOs of an integrated circuit). A common approach is simply to over-allocate support resources for various functional blocks to ensure that the capabilities of these support resources will not (ideally, never) be saturated. However, this often results in a high degree of waste, in that, such support resources are simply sitting idly and being unused. As such, it is clear there is a need in the art for some means by which greater flexibility may be provided to the various functional blocks within devices to accommodate changing needs and/or operating conditions of the device FIG. 1 is a diagram illustrating a prior art embodiment of FPGAs (Field Programmable Gate Arrays) operating such that each FPGA has its own dedicated resources. A number of FPGAs (shown as FPGA 110, FPGA 120, and FPGA 130) are all interconnected via an FPGA interconnection 101. It is noted that the FPGA interconnection 101 is typically implemented using a number of parallel buses that interconnect each of the individual functional components of each of the FPGAs. This can be a very inefficient and cumbersome way in which to interface the various FPGAs.

Each of the FPGAs includes various types of functionality. For example, the FPGA 110 includes embedded processing functionality 112, block memory 114, and CLBs (Configurable Logic Blocks) 116. The embedded processing functionality 112 may be an actual integrated circuit that is operable to perform various digital signal processing functions, such as multiplication. The block memory 114, such as a block random access memory (BRAM), may be used by the embedded processing functionality 112. The CLBs 116 may be viewed as being reconfigurable circuitry that is able to support various logic functions such as OR gates, AND gates, NAND gates, XOR gates, among other types of logic functions. Generally speaking, the CLBs 116 may be viewed as being reconfigurable circuitry that is operable to be implemented to support and perform any of a wide variety of logic functional processing including various logic functions having various numbers of inputs and outputs. Each of the other FPGA 120 and FPGA 130 includes its corresponding dedicated support resources as well. For example, the FPGA 120 includes embedded processing functionality 122, block memory 124, and CLBs 126, and the FPGA 130 includes embedded processing functionality 132, block memory 134, and CLBs 136. A description of a conventional FPGA is found in the Virtex-II Pro Platform FPGA Handbook, October 2002, from Xilinx Inc. of San Jose, Calif.

Again, an mentioned above, each of the individual functional components of each of the FPGAs is interconnected via the FPGA interconnection 101 using various parallel buses included therein. For example, when the embedded processing functionality 112 is to be communicatively coupled to either the embedded processing functionality 122 or the embedded processing functionality 132, or vice versa, then a relatively large parallel bus is employed to perform this actual interfacing. Similarly, when the block memory 114 is to be communicatively coupled to either the block memory 124 or the block memory 134, or vice versa, then a relatively large parallel bus is employed to perform this actual interfacing. Lastly, as shown within this example embodiment, when the CLBs 116 are to be communicatively coupled to either the CLBs 126 or the CLBs 136, then a relatively large parallel bus is also employed to perform this actual interfacing. The number of parallel lines within each of the various types of parallel buses that are employed to communicatively couple each of the various types of individual functional components within each of the FPGAs may vary in size and number. Clearly, this is a prior art approach to interfacing the various individual functional components within each of the FPGAs can be very intensive and cumbersome.

The manner in which communication is performed along these various parallel buses can be unique for various types of FPGA applications. That is to say, different users may implement the interfacing in different manners. This variability in the manner by which the individual functional components within each of the FPGAs are interfaced only contributes to the lack of uniformity and commonality of the manner by which the various FPGAs operate within a larger application.

This multiple FPGA arrangement can suffer from many of the deficiencies described above, in that, each of the individual FPGAs sometimes does not have a sufficient amount of support resources available to perform the functionality it is intended to do. Block memory is one particular type of support resource that is typically consumed and capitalized upon very quickly. When the block memory of any FPGA is consumed, then a quick solution approach is simply to use the available CLBs on that particular FPGA. However, this is a very inefficient usage of the CLB functionality provided by an FPGA. The inflexibility of this prior art approach, in that, each FPGA is limited to the support resources that have been implemented therein can present difficulty in various designs. Moreover, even when designers seek to try to interface one FPGA to another, there does not exist in the art a common means or approach by which this can be done. There is an extremely large number of means by which this interfacing may be performed, and it can vary greatly from one implementation to another. Clearly, there is a need in the art to allow for a better means of interfacing FPGAs to one another and also a means that can address the design challenges and inflexibility of statically dedicated support resources within an FPGA.

BRIEF SUMMARY OF THE INVENTION

Various aspects of the invention can be found in a programmable logic device (PLD) such as a FPGA (Field Programmable Gate Array) or complex programmable logic device (CPLD) or other programmable logic array. The PLD may include a variety of embedded functionality in addition to reconfigurable circuitry that is operable to be implemented to support and perform any of a wide variety of logic or other functional processing including various logic functions having various numbers of inputs and outputs. Generally speaking, the PLD includes embedded functionality and a virtual extender plugin. The embedded functionality is operable to perform processing according to a functionality format. The virtual extender plugin is communicatively coupled to the embedded processor functionality via an on on-chip bus. The virtual extender plugin is operable to transform functionality format of the embedded functionality to a serial format and vice versa. The virtual extender plugin is operable to transmit the serial formatted data via a high speed serial line communicatively coupled to the FPGA. The PLD may be communicatively coupled to one or more other PLDs via a wide variety of means including a PCB (Printer Circuit Board) interconnect, a backplane, and/or a line card.

As mentioned above, the embedded functionality of the PLD can perform a wide variety of functions. In line with this, the virtual extender plugin may be implemented in a variety of different ways to comport with one or more particular types of embedded functionality of the PLD. That is to say, the virtual extender plugin described herein may be implemented according to a relatively wide variety of applications. In one instance, the use of a virtual extender plugin allows a user to expand the memory space or increase the OPB (On-chip Peripheral Bus) peripheral-related space within a PLD. Generally speaking, each of the various types of applications could have its own unique type of virtual extender plugin. For another example, a virtual extender plugin adapted to increase memory could be referred to as a VME (Virtual Memory Extender). A virtual extender plugin adapted to increase processing capabilities of a device could be referred to as a VBE (Virtual Bus Extender). Similarly, a virtual extender plugin adapted to provide rapid access to stored information or reconfigurable logic circuitry could be referred to as a VLE (Virtual Look-Up Table Extender). Other types of virtual extender plugins could also be implemented without departing from the scope and spirit of the invention. When implementing each of these various types of virtual extender plugin, the "extender" is an actual plugin that allows a user to expand and use the functionality provided by such extenders (be it memory, processing capability, CLB, or some other type of functionality) without having to design a separate and distinct proprietary design.

Practically speaking, these virtual extender plugins actually "plug in" to a standard bus or a user-defined bus (e.g., a known type of memory bus such as an IBM CoreConnect bus, an OPB (On-chip Peripheral Bus) bus, or some other type of known or user-defined bus) and then translate that bus into a single MGT (Multi-Gigabit Transceiver) serial data stream having a standardized/known type of serialized format such that every type of virtual extender plugin uses that particular serialized format. This serial stream is then transmitted from the current location to another virtual block that is located on another FPGA. This serial stream is then de-serialized and translated back to the original required bus format. Borrowing on the relatively fast operational speeds of MGTs, a user could add new off-chip modules without any performance degradation.

The use of a virtual extender plugin as presented herein provides for much improved flexibility and adaptability to the changing needs of an PLD in terms of the support resources employed therein. Embodiments of the invention envision any type of devices that supports the functionality and/or processing described herein. Moreover, various types of methods may be performed to support the functionality described herein without departing from the scope and spirit of the invention.

DETAILED DESCRIPTION OF THE INVENTION

Figure 1:
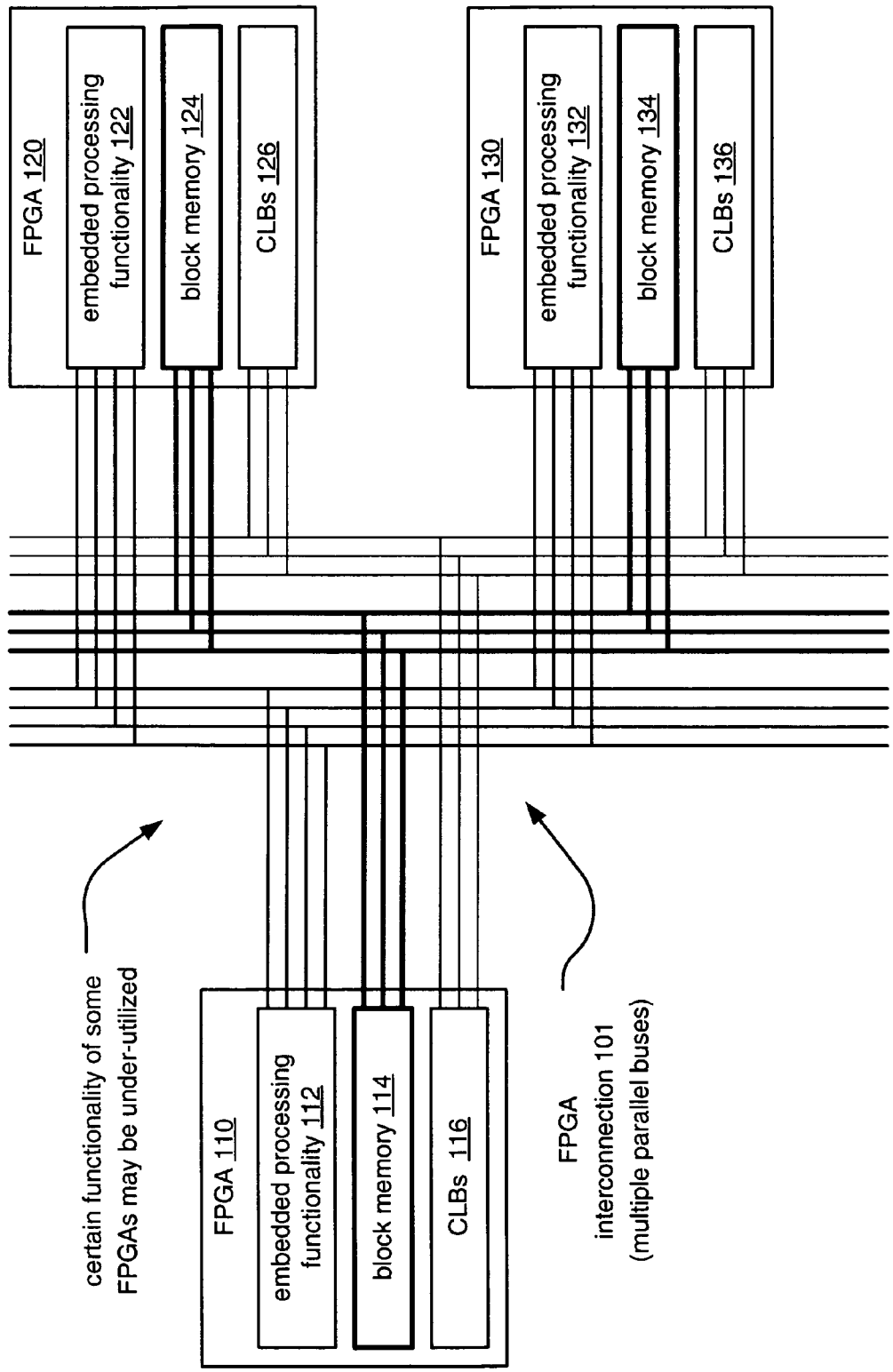
FIG. 1 is a diagram illustrating a prior art embodiment of FPGAs (Field Programmable Gate Arrays) operating such that each FPGA has its own dedicated resources.

A novel approach is presented herein by which a virtual extender plugin allows a user seamlessly to bridge between various functional blocks on different devices when designing and implementing electronic devices. These various types of functional blocks may include memory, embedded, microprocessor(s), microprocessor peripherals, CLBs (Configurable logic blocks), I/O blocks (Input/Output circuits and/or ports), FIFOs, MGTs (Multi-gigabit transceivers), DCM (Digital Clock Managers), multipliers, adders, DSPs (digital signal processing circuit blocks), and even other categories of functional blocks including various application specific circuits. These virtual extender plugins, allow for the efficient use of the various untapped resources that may be provided by functional blocks of another device. For example, a given functional block on one PLD may employ one or more virtual extender plugins to have access to and to use the various untapped (or relatively lightly tapped) functionality of the functional blocks on another PLD. In a particular implementation, the virtual extender plugin of a first FPGA actually "appears" simply to be another functional block contained within that actual first FPGA. The virtual extender plugin is actually transparent to the actual FPGA employing it. As an example, a virtual extender plugin within a first FPGA that is implemented to perform the interfacing to CLBs located on a second FPGA will actually appear as simply CLBs within the first FPGA, functionally speaking. The virtual extender plugin is therefore transparent to the first FPGA, in that, the virtual extender plugin simply appears to be a functional block providing the appropriate functionality of the functional block on the second FPGA to which it interfaces. Moreover, the manner by which the virtual extender plugins allow the interfacing of the various functional blocks within FPGAs is seamless, in that, there is no degradation of performance. That is to say, the overall throughput within the overall device (and system in which the device is implemented) is not reduced by the use of these virtual extender plugins.

As an example of the use of such virtual extender plugins, a first functional block could use the untapped FPGA resources (e.g., memory, microprocessor peripherals, CLBs including LUTs, IOs, memory, embedded microprocessor blocks) from other FPGAs. As another example of the use of such virtual extender plugins, the generated bridge could serve as a debugging port between various functional blocks and/or devices. It is also noted that any of the various types of FPGAs that are employed and described herein may be viewed as being a system on a chip, in that, a very broad amount of functionality can be implemented herein. Within each of the various FPGAS, a significant amount of interfacing may exist between the various functional blocks contained therein. Internal to any given FPGA, large parallel buses may be implemented therein. However, for any of these various types of large parallel buses that may be employed within a given FPGA, an appropriately implemented virtual extender plugin can perform the transformation from the parallel format used by that particular parallel bus to the standardized or user-defined serial format employed between this FPGA and any other FPGA. While the description herein describes a virtual extender plug-in on an FPGA, this is only one embodiment of the present invention. Other embodiments include an Integrated circuit (IC) comprising a virtual extender plug-in having an MGT, where the MGT of a first IC provides a high speed serial connection to an MGT of a second IC with the extended resources to be used by the first IC via the virtual extender plug-in.

Thus one embodiment of the present invention includes a system for extending a resource, such as a microprocessor, a microprocessor peripheral, a memory, LUT, CLB or other embedded functional resource, of a first integrated circuit (IC). The system includes a first virtual extender plug-in having a first multi-gigabit transceiver, where the first virtual extender plug-in is formed in the first IC and is coupled to the first IC resource; a second virtual extender plug-in having a second multi-gigabit transceiver, where the second virtual extender plug-in is formed in the second IC and is coupled to a second IC resource; and a communication link connecting the first multi-gigabit transceiver to the second multi-gigabit transceiver. One advantage of the system is the virtual extender plug-in connections make the second IC resource act like it is on the same IC as the first IC resource, i.e., the resources of the first IC have been virtually increased.

Figure 2:
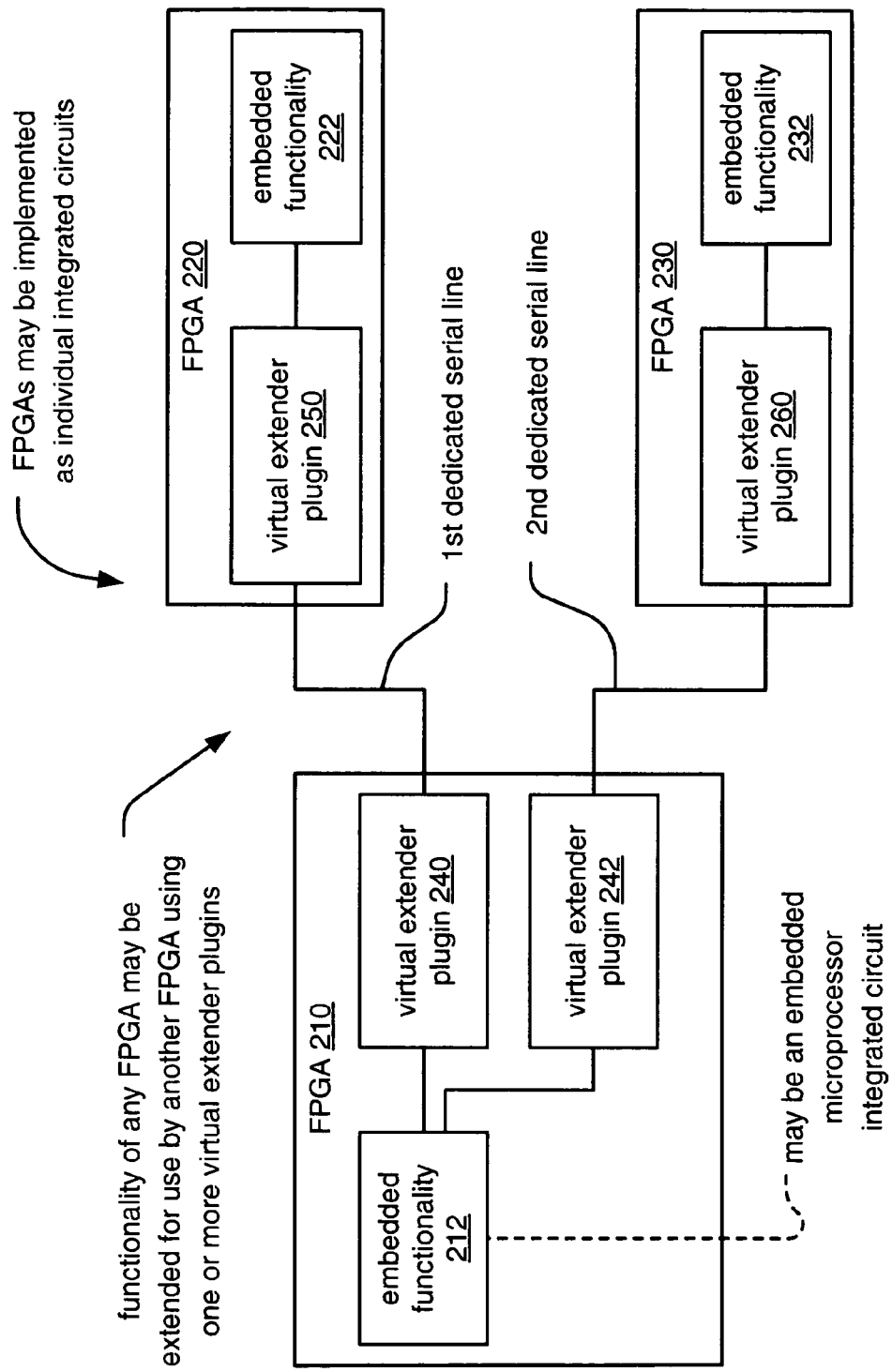
FIG. 2 is a diagram illustrating an embodiment of a number of PLDs implemented such that each PLD has its own virtual extender plugin that is capable of interfacing and accessing functionality of other of the PLDs according to certain aspects of the invention.

FIG. 2 is a diagram illustrating an embodiment of a number of FPGAs implemented such that each FPGA has its own virtual extender plugin that is capable of interfacing and accessing functionality of other of the FPGAs according to certain aspects of the invention. Each of an FPGA 210, an FPGA 220, and an FPGA 230 are all able to communicate with one another via one or more FPGA interconnections that can be implemented as high speed, dedicated serial lines, for example, using Multi-gigabit transceivers (MGTs) as available in the Virtex-II Pro FPGA from Xilinx, Inc. of San Jose, Calif. Each of the FPGA 210, the FPGA 220, and the FPGA 230 includes corresponding embedded functionality and a virtual extender plugin. Each of the embedded functionality may be viewed generally as performing its corresponding type of processing according to a particular functionality format. For example, microprocessor type embedded functionality performs processing according to a functionality format corresponding to the manner in which data are taken in, processed, and passed out from the microprocessor type embedded functionality. When the embedded functionality is of another type, then the embedded functionality deals with inputs and outputs according to that particular type. Regardless of which particular type of processing or functionality is provided by the embedded functionality, the appropriate transformation can be made to and from that particular type of processing or functionality when converting to and from a format that is appropriate for transmission to and from the FPGA interconnection 201.

Specifically looking at this diagram, the FPGA 210 includes embedded functionality 212, a virtual extender plugin 240, and a virtual extender plugin 242. The FPGA 220 includes embedded functionality 222 and a virtual extender plugin 250, and the FPGA 230 includes embedded functionality 232 and a virtual extender plugin 260. Each of the virtual extender plugin 240, the virtual extender plugin 250, and the virtual extender plugin 260 may be viewed as being themselves embedded functional blocks within their respective FPGAs that allow for the efficient interfacing with the other of the FPGAs.

Via these virtual extender plugins, the various FPGAs are able to access and employ the functionality that is available within another FPGA via high speed, dedicated serial lines that may be set up between these FPGAs. For example, the embedded functionality 212 within the FPGA 210 is operable to employ and communicatively couple the functionality provided by the embedded functionality 222 within the FPGA 220 via a $1^{st}$ dedicated serial line that is set up between the virtual extender plugin 240 within the FPGA 210 and the virtual extender plugin 250 within the FPGA 220. Additionally, the embedded functionality 212 within the FPGA 210 is also operable to employ and communicatively couple the functionality provided by the embedded functionality 232 within the FPGA 230 via a $2^{nd}$ dedicated serial line that is set up between the virtual extender plugin 240 within the FPGA 210 and the virtual extender plugin 260 within the FPGA 230.

The use of these virtual extender plugins allow for a very flexible means by which FPGAs may interface with one another. Moreover, this approach of employing virtual extender plugins can provide for a standard or user-defined means by which FPGAs may interface with one another. Each of the virtual extender plugins may be implemented using very fast serializer/de-serializer functionality such that each of the various resources on any given FPGA can be accessed by another FPGA via a very high speed serial link. Various alternative embodiments are provided below by which this type of interfacing may be performed.

Each of the FPGA 210, the FPGA 220, and the FPGA 230 may be implemented as each being an individual integrated circuit in some embodiments. This is also true for each of the various other embodiments describer herein.

Figure 3:
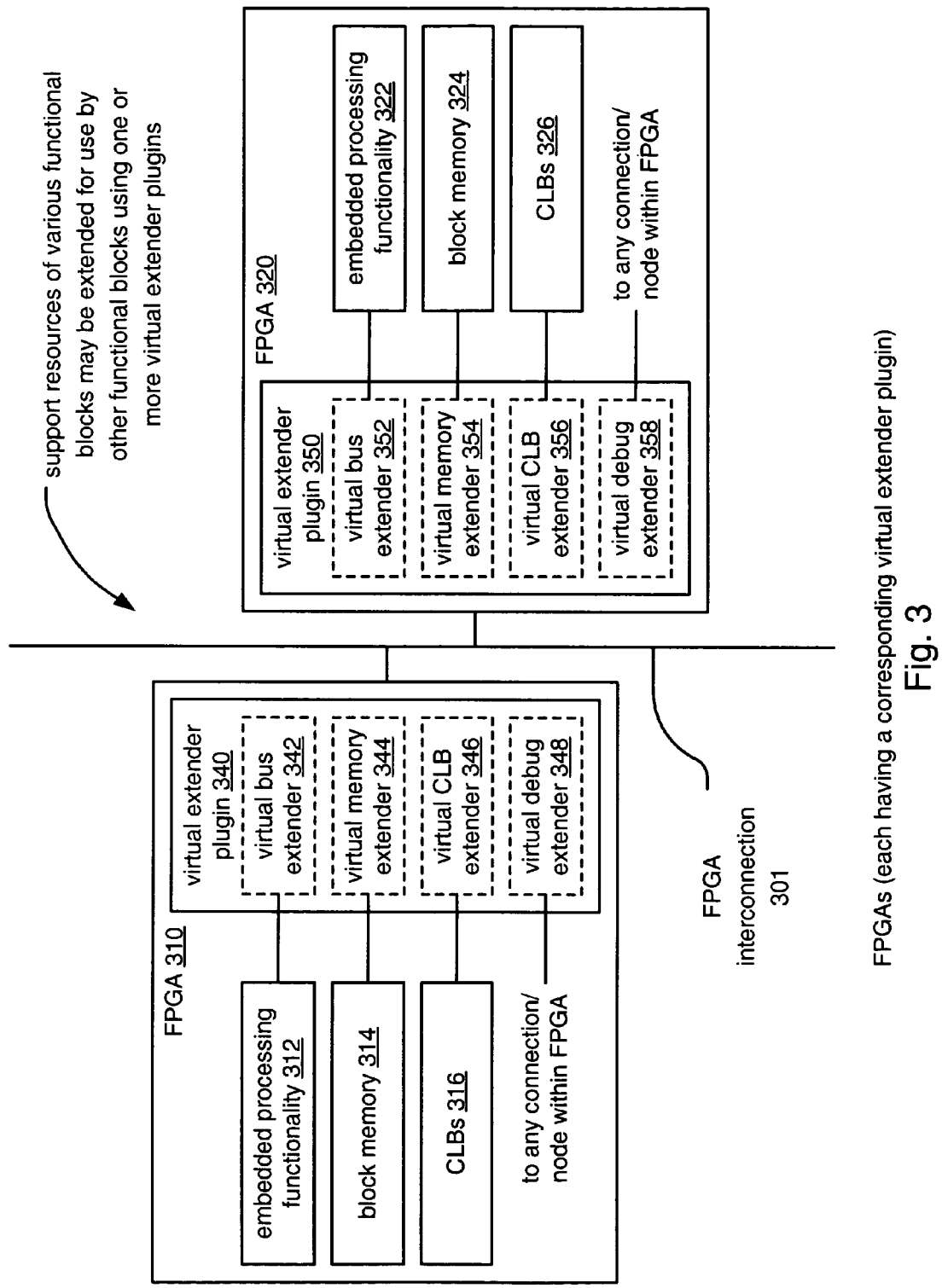
FIG. 3 is a diagram illustrating an alternative, more detailed embodiment of a number of PLDs implemented such that each PLD has at least one virtual extender plugin according to certain aspects of the invention.

FIG. 3 is a diagram illustrating an alternative, more detailed embodiment of a number of FPGAs implemented such that each FPGA has at least one virtual extender plugin according to certain aspects of the invention. This diagram shows an FPGA 310 and an FPGA 320 that are communicatively coupled via an FPGA interconnection 301. Each of these individual FPGAs includes embedded processing functionality, block memory (that may be employed by the embedded processing functionality), and CLBs, which may include Look-up-tables (LUTs). Specifically, the FPGA 310 includes embedded processing functionality 312, block memory 314, and CLBs 316. The FPGA 320 includes embedded processing functionality 322, block memory 324, and CLBs 326. In addition, each of the FPGAs includes at least one virtual extender plugin. For example, the FPGA 310 includes a virtual extender plugin 340. The virtual extender plugin 340 may include one or more specifically adapted virtual extender plugins. For example, the virtual extender plugin 340 may include a virtual bus extender 342 that is adapted to allow the embedded processing functionality 312 to interface with the FPGA interconnection 301. The virtual extender plugin 340 may also be implemented to include functionality of a virtual memory extender 344 that is adapted to allow the block memory 314 to interface with the FPGA interconnection 301. In addition, the virtual extender plugin 340 may also be implemented to include functionality of a virtual CLB extender (e.g., a virtual LUT extender) 346 that is adapted to allow the CLBs (e.g., LUTs) 316 to interface with the FPGA interconnection 301.

Similarly, the virtual extender plugin 350 may include a virtual bus extender 352 that is adapted to allow the embedded processing functionality 322 to interface with the FPGA interconnection 301. The virtual extender plugin 320 may also be implemented to include functionality of a virtual memory extender 344 that is adapted to allow the block memory 324 to interface with the FPGA interconnection 301. In addition, the virtual extender plugin 350 may also be implemented to include functionality of a virtual CLB extender (e.g., a virtual LUT extender) 356 that is adapted to allow the CLBs (e.g. LUTS) 326 to interface with the FPGA interconnection 301.

In addition, the virtual extender plugin 340 may be implemented to include a virtual debug extender to allow access to any of the connections/nodes within the FPGA 310 via the FPGA interconnection 301. This virtual debug extender 346 could allow a user to debug and analyze any of the signals existent within the FPGA 310. Similarly, the virtual extender plugin 350 may be implemented to include a virtual debug extender to allow access to any of the connections/nodes within the FPGA 320 via the FPGA interconnection 301. Also similarly, the virtual debug extender 356 could allow a user to debug and analyze any of the signals existent within the FPGA 320.

These virtual extender plugins described herein may be implemented according to a relatively wide variety of applications. Some specific examples are provided below to show some of the advantageous aspects of the virtual extender plugin approach to extending functionality in some particular contexts. In one instance, the use of a virtual extender plugin allows a user to expand the memory space or increase the OPB (On-chip Peripheral Bus) peripheral-related space within a device. Generally speaking, each of the various types of applications could have its own unique type of virtual extender plugin. For example, a virtual extender plugin adapted to increase memory could be referred to as a VME (Virtual Memory Extender). A virtual extender plugin adapted to increase processing capabilities of a device could be referred to as a VBE (Virtual Bus Extender). Similarly, a virtual extender plugin adapted to provide rapid access to stored information or reconfigurable logic circuitry could be referred to as a VLE (Virtual Look-Up Table Extender). Other types of virtual extender plugins could also be implemented without departing from the scope and spirit of the invention. When implementing each of these various types of virtual extender plugin, the "extender" is an actual plugin that allows a user to expand and use the functionality provided by such extenders (be it memory, processing capability, LUT, or some other type of functionality) without having to design a separate and distinct proprietary design.

Practically speaking, these virtual extender plugins actually "plug in" to a standard bus or a user-defined bus (e.g., a known type of memory bus such as an IBM CoreConnect bus, an OPB (On-chip Peripheral Bus) bus, or some other type of known or user-defined bus) and then translate that bus into a single MGT (Multi-Gigabit Transceiver) stream having a standardized/known type of serialized format such that every type of virtual extender plugin uses that particular serialized format. This serial stream is then transmitted from the current location to another virtual block that is located on another FPGA. This stream is then de-serialized and translated back to the original required bus. Borrowing on the relatively fast operational speeds of MGTs, a user could add new off-chip modules without any performance degradation.

Although some of the various embodiments presented below differ in their respective and specific application, each of the various types of virtual extender plugins can be implemented using a common plugin design. That is to say, regardless of which particular type of application is being performed, the same type of virtual extender plugin functional block may be employed. This clearly provides a very flexible and broad-based design that is capable of interfacing FPGAs and the various functionality types that are provided therein. Effectually, this common type of plugin design may be viewed as being a functional "black box" selectable design component that is employed within the FPGA.

Figure 4:
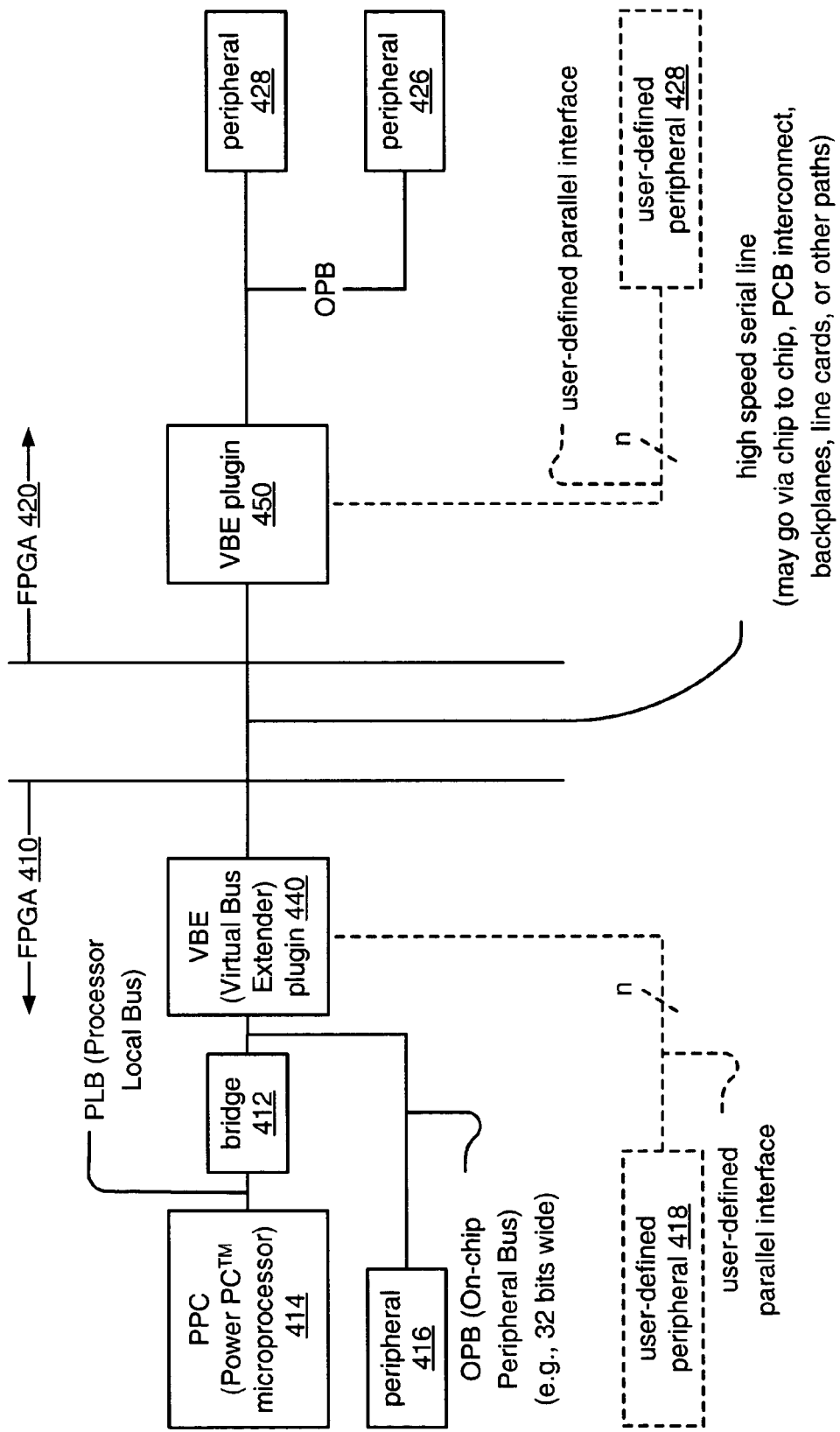
FIG. 4 is a diagram illustrating an embodiment of VBE (Virtual Bus Extender) functionality that is arranged according to certain aspects of the invention.

FIG. 4 is a diagram illustrating an embodiment of VBE (Virtual Bus Extender) functionality that is arranged according to certain aspects of the invention. Two different FPGAs (shown as an FPGA 410 and an FPGA 420) are communicatively coupled via a very high speed serial line. This high speed serial line may include interconnection via a chip to chip connection, a PCB (Printer Circuit Board) interconnect, a backplane, a line card, and/or any other paths by which one FPGA may be communicatively coupled to another FPGA.

The FPGA 410 includes a PPC (Power PC™ microprocessor) 414 that communicatively couples to a bridge via a PLB (Processor Local Bus). The PLB is a very high speed bus that is specifically adapted to service the PPC 414 and communicatively couple the PPC 414 to the rest of the FPGA 410 via a bridge 412. Oftentimes such a PPC 414 employs one or more peripheral functional blocks when performing various processing function. In this diagram, a peripheral 416 is communicatively coupled to the PPC 414 on the other side of the bridge 412 via an OPB (On-chip Peripheral Bus). An OPB is generally a much slower bus than a PLB.

Additionally, a user-defined peripheral 418 may also be implemented within the FPGA 410 that is also operable to employ and communicatively couple the functionality provided by another user-defined peripheral 428 that may be implemented within the FPGA 420. The manner in which each of the user-defined peripheral 418 and the user-defined peripheral 428 interfaces within other functional blocks within their corresponding FPGA may involve employing parallel buses (e.g., being n bits wide) that may be referred to as user-defined parallel interfaces. The appropriate serial to parallel (and parallel to serial) transformations can be made within each of the VBE plugin 440 and the VBE plugin 450 to transform to and from the parallel formats (e.g., being n bits wide) to the serial format employed via the high speed serial line communicatively coupling between the VBE plugin 440 and the VBE plugin 450.

Oftentimes, the PPC 414 may require additional peripheral functionality that is not provided within the FPGA 410. A VBE plugin 440 is implemented to allow the PPC 414 to access peripheral functionality that is resident on another FPGA, namely, the FPGA 420 in this diagram. Another VBE plugin 450 is implemented on the FPGA 420 that allows access to a peripheral 426 and a peripheral 428 via an OPB within the FPGA 420. Using the interfacing provided by the VBE plugin 440 and the VBE plugin 450, the PPC 414 can access and use the functionality of each of the peripheral 426 and the peripheral 428.

From an operating perspective, the VBE plugin 440 appears to be the peripheral functional block that is employed by the PPC 414. That is to say, the functionality of whichever peripheral (or both peripherals) is being accessed by the PPC 414 is performed in such a way that the VBE plugin 440 will "appear" to be that particular peripheral from the perspective of the PPC 414. Perhaps more specifically, when the PPC 414 need the functionality provided by either of the peripherals within the FPGA 420, it accesses those peripherals via the VBE plugin 440.

The VBE functionality illustrated in this diagram allows an OPB extension to be performed between various FPGAs using the VBE plugins implemented therein. The operation of each of the VBE plugins may be viewed as performing the transformation of a data bus format, that is appropriate for processing by the PPC (or an embedded microprocessor integrated circuit), to a serial format that is appropriate for transmission via the high speed serial line that communicatively couples the FPGA 410 and the FPGA 420. The operation of each of the VBE plugins also performs the opposite directional transformation (e.g., from the serial format to the data bus format).

As also described below in a general view of a virtual extender plugin layout, a MGT (Multi-Gigabit Transceiver) (that is itself apart of any one of the various types of virtual extender plugins described herein), may provide the actual formatting to communicate across a very high serial link between the FPGAs.

Figure 5:
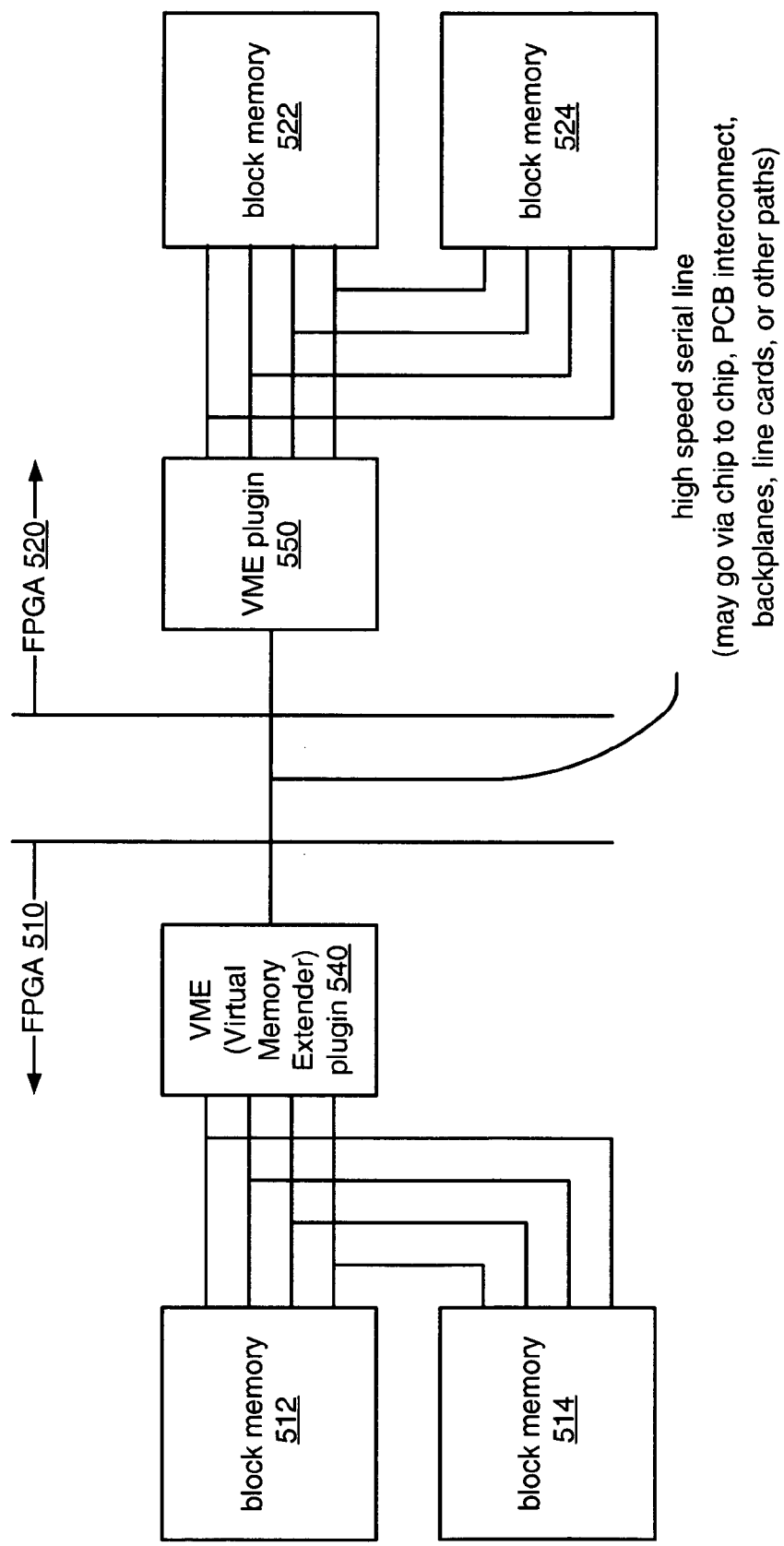
FIG. 5 is a diagram illustrating an embodiment of VME (Virtual Memory Extender) functionality that is arranged according to certain aspects of the invention.

FIG. 5 is a diagram illustrating an embodiment of VME (Virtual Memory Extender) functionality that is arranged according to certain aspects of the invention. According to the prior art, a user could employ a standard parallel memory bus and control signal to connect one FPGA to another FPGA's memory. However, if instead a VME is employed, then the user would not need to build the specific PCB IO (Printer Circuit Board Input/Output) functionality and ports to expand the memory map of the original device using some proprietary type means. Instead, as long as each of the two devices includes functionality to support a VME plugin (e.g., including an MGT (Multi-Gigabit Transceiver)), then a VME plugin could be employed to extend the memory of one FPGA using the available memory resources of another FPGA.

In this diagram, the VME functionality allows a 32/64 basic block memory extension between an FPGA 510 and an FPGA 520 via a VME plugin 540 and a VME plugin 550, respectively, and the corresponding MGTs that may be implemented therein. This VME functionality allows for the capability of extending a user's block memory map for use in various applications. The use of the VME plugin 540 and the VME plugin 550 make the 32/64 bit to MGT and MGT to 32/64 bit transformations and interfacing seamless via the very high speed serial line interconnecting the two FPGAs. The FPGA 510 includes two separate block memories (block memory 512 and block memory 514). The VME plugin 540, the block memory 512, and the block memory 514 are all communicatively coupled to one another via a multiple line bus. The VME plugin 540 and the VME plugin 550 are connected together via a very high speed serial line. The FPGA 520 includes two separate block memories (block memory 522 and block memory 524). The VME plugin 550, the block memory 522, and the block memory 524 are all also communicatively coupled to one another via a multiple line bus.

Figure 6:
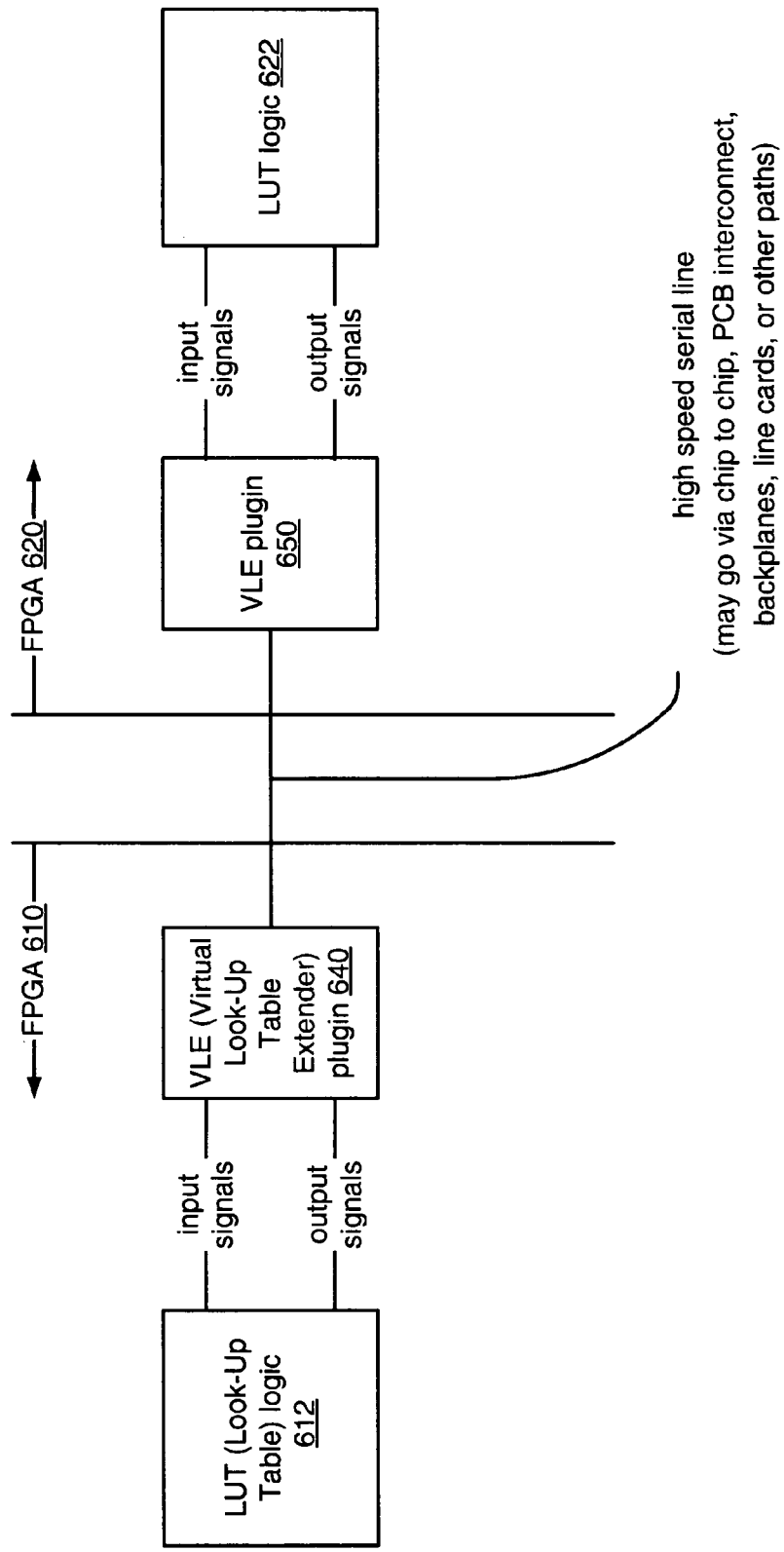
FIG. 6 is a diagram illustrating an embodiment of VLE (Virtual Look-Up Table Extender) functionality that is arranged according to certain aspects of the invention.

FIG. 6 is a diagram illustrating an embodiment of VLE (Virtual Look-Up Table Extender) functionality that is arranged according to certain aspects of the invention. This diagram shows how VLE functionality can allow LUT extension between an FPGA 610 and an FPGA 620 via a VLE plugin 640 and a VLE plugin 650, respectively, and the corresponding MGTs that may be implemented therein. Each of the FPGAs includes LUT logic. The FPGA 610 includes LUT logic 612 that is communicatively coupled to VLE plugin 640, and the FPGA 620 includes LUT logic 622 that is communicatively coupled to VLE plugin 650. The VLE 640 communicatively couples to the LUT logic 612 via input and output signals, and the VLE 650 communicatively couples to the LUT logic 622 via input and output signals.

This VLE functionality allows the capability of expanding a user's design space, in that, the user can have access to a much larger amount of LUTs and the reconfigurable logic that can be implemented therein. As also mentioned above, such LUTs may be viewed as being reconfigurable circuitry that is operable to be implemented to support and perform any of a wide variety of logic functional processing including various logic functions having various numbers of inputs and outputs.

Many various designs and approaches may be implemented using the VLE functionality described herein. One particular embodiment may include partitioning different types of logic between the various FPGAs within a system.

For example, a large algorithmic design approach could be implemented using the LUT logic 612 within the FPGA 610, and control logic could be implemented using the LUT logic 622 within the FPGA 620. The use of the VLE plugin 640 and the VLE plugin 650 make the LUT/function requirement to MGT and MGT to LUT/function requirement transformations and interfacing seamless via the very high speed serial line interconnecting the two FPGAs.

Figure 7:
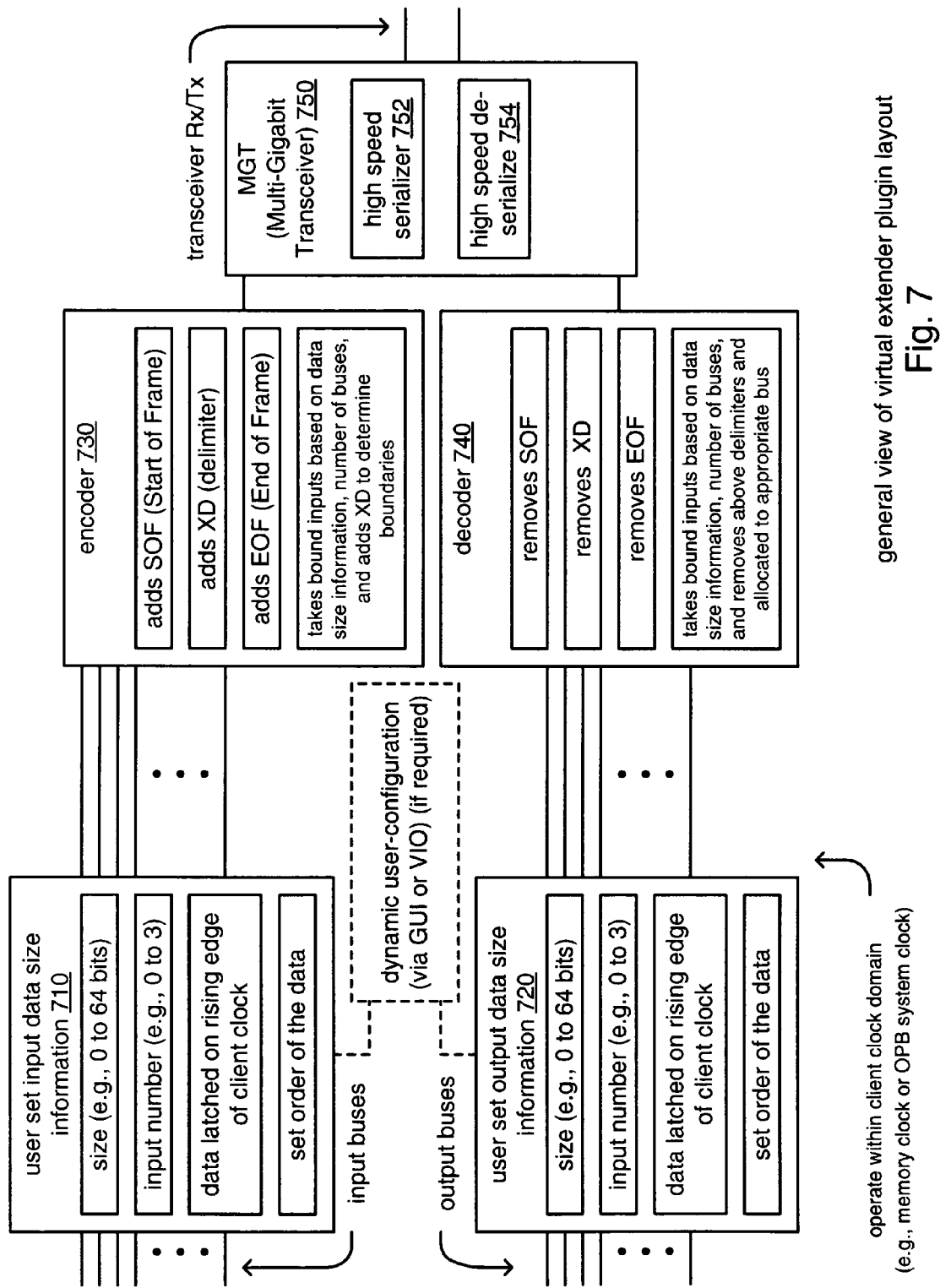
FIG. 7 is a diagram illustrating an embodiment of a general view of a virtual extender plugin layout according to certain aspects of the invention.

FIG. 7 is a diagram illustrating an embodiment of a general view of a virtual extender plugin layout according to certain aspects of the invention. Generally speaking, the virtual extender plugin may be implemented to allow parameters that enable a user to perform a variety of functions including: setting their own system clock (e.g., how fast to send the data down the pipe), setting the order by which the bus data is sent (e.g., data first or control first), and setting the size of the buses (e.g., some buses may be 2 or 3 control lines only). The virtual extender plugin also implemented MUXes to assist in the processing of the client data within a client clock cycle. One possible embodiment of processing of the client data within a client clock cycle is provided with respect to the timing diagram below.

This general view of a virtual extender plugin layout includes an MGT (Multi-Gigabit Transceiver) 750 that is operable to perform the serializing and de-serializing of information via the very high speed serial line connecting to another FPGA. The MGT 750 includes a high speed serializer 752 that is operable to perform the appropriate formatting and conversion of whichever functionality is being extended into a serial format for transmission across the very high speed serial line. Again, this conversion can be particularly tailored depending on which type functionality is being extended (e.g., block memory, LUT, peripheral, and so on). The MGT 750 also includes a high speed de-serializer 754 that is operable to perform the appropriate formatting and conversion of from a serial format back to the format of whichever functionality is being extended.

This virtual extender plugin layout includes a number of input buses that communicatively couple to an encoder 730 that performs the appropriate formatting of a signal for providing to the MGT 750 and for subsequent transmission via an output line of the very high speed serial line. The very high speed serial is shown here as being a differential signal line. Differential signal lines are known to provide for many beneficial effects including noise immunity.

Many operational parameters of the information coming in via the input buses may be user defined. User set input data size information 710 shows a number of parameters that can be selected by a user including the size of the data (e.g., 0 to 64 bits), the input number (e.g., 0 to 3), and the manner in which the data is to be latched (e.g., data latched on the rising edge of the client clock). In addition, this input data size information 710 can also ensure that data is appropriately ordered when it is to be provided to the encoder 730. The encoder 730 performs the appropriate formatting of the input information including adding the SOF (Start of Frame) code, adds at least one XD (delimiter), and adds the EOF (End of Frame) code. The encoder 730 also takes the bound inputs based on the data size information, the number of buses, and then adds the XD to determine the boundaries of the input information. The decoder 740 performs the opposite type formatting functionality as the encoder 730 with respect to interfacing to the very high speed serial bus. The decoder 730 removes the SOF, removes the XD, and removes the EOF of incoming serially formatted data that is received from the very high speed serial bus interconnecting FPGAS. In addition, the decoder 740 takes the bound inputs based on the size inputs and removes the above mentioned delimiters and allocates the formatted signal to the appropriate output bus.

A user set output data size information 720 also shows a number of parameters that can be selected by a user. These parameters typically correspond to the parameters within the user set input data size information 710 so that the appropriate serial to parallel (and parallel to serial) transformation can be made. It is also noted that these various parameters (as shown within the functional blocks 710 and 720) can be implemented in any number of ways. They may be static, in that, they are configured only one time in the actual source code employed by the device, and they are never changed. Alternatively, these parameters may undergo dynamic user-configuration via a GUI (Graphical User Interface) that allows the modification of one or more of these parameters via an OPB or VIO (Virtual Input/Output) of the device as desired or required in a particular application. The modification of any of these parameters may be performed based on the user's particular desire, the operating conditions of the device (or system in which the device is implemented), or any other criterion.

It is also noted that, as a user is designing and programming an FPGA, the throughput of the serial interface selected by the user is calculated and provided to the user. This calculation is made so that the user can be sure that the serial line that is being employed (via the appropriate virtual extender plugins) to provide the additional functionality has sufficient capacity. For example, the high speed, dedicated serial line must provide sufficient throughput so that the use to this functionality on another FPGA is transparent to the original FPGA that is seeking to employ it. That is to say, the throughput that would have been provided on-chip by such a functional block contained within the FPGA (via typical on-chip parallel buses) is ensured also to be provided via the high speed, dedicated serial line (via the appropriate virtual extender plugins) that communicatively couples to/from another FPGA. By ensuring that an actually comparable amount of throughput may be provided, the use of these virtual extender plugins is seamless, in that, there is no degradation of performance.

Figure 8:
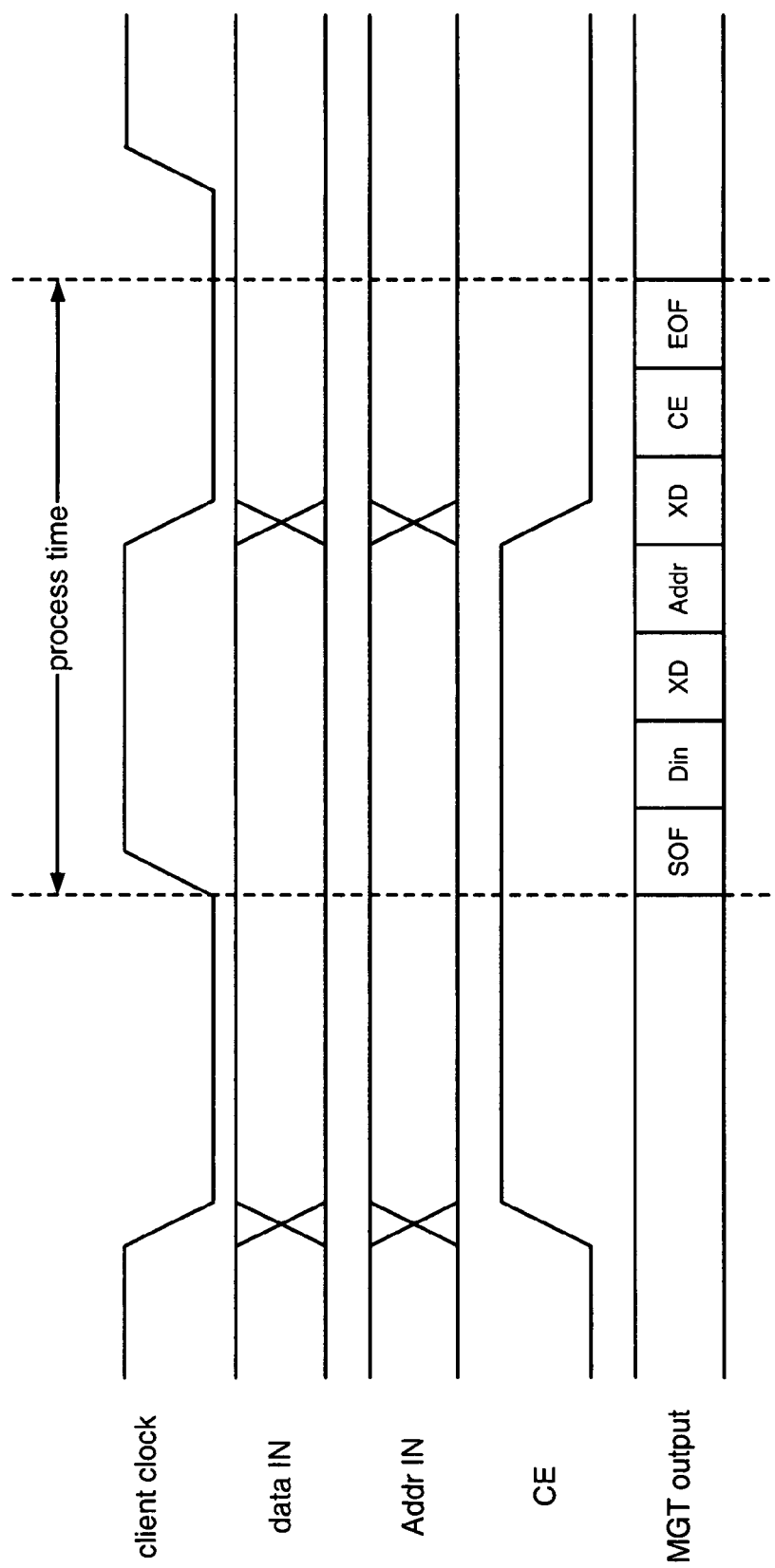
FIG. 8 is a diagram illustrating an embodiment of a virtual extender plugin timing diagram according to certain aspects of the invention.

FIG. 8 is a diagram illustrating an embodiment of a virtual extender plugin timing diagram according to certain aspects of the invention. This timing diagram shows one possible means by which the bridge conversion may be performed. As mentioned above, this diagram shows one possible embodiment of processing of the client data within a client clock cycle is provided with respect to the timing diagram below.

This embodiment shows that the virtual client data (memory data in this particular example) must be latched on the rising edge of the client data and processed well before the next rising edge of the client. The MGT sequence can be reordered depending on the user's requirements. For example, the address data (shown as Addr IN) can go before the CE and so on; CE has a frequency that is half of the client clock cycle. The demuxing is done using the XD. Each XD determines the boundary between the buses. The complete transaction is bounded by a SOF (Start of Frame) code and EOF (End of Frame) code.

Figure 9:
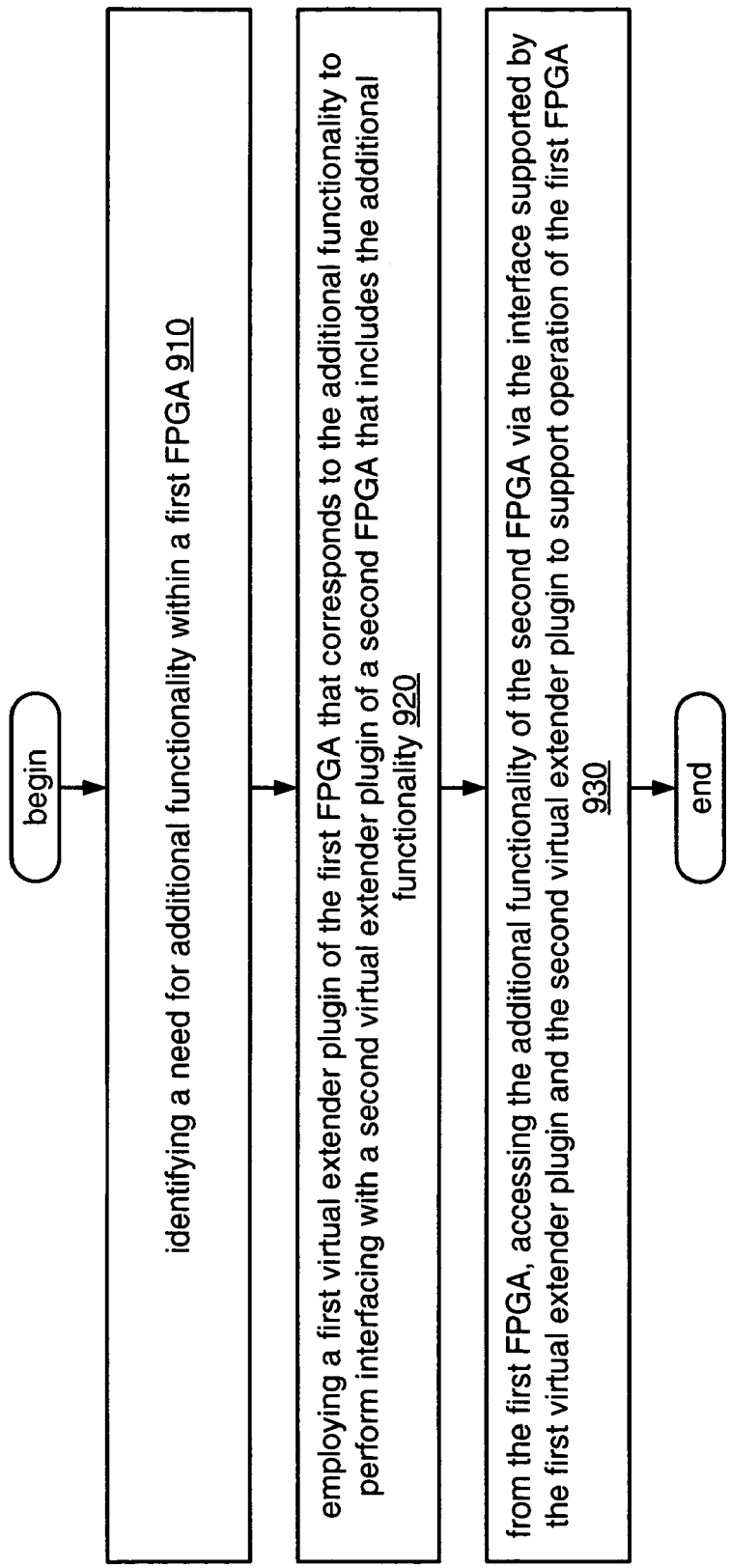
FIG. 9 is a flowchart illustrating an embodiment of a method for extending functionality of an FPGA according to aspects of the invention.

FIG. 9 is a flowchart illustrating an embodiment of a method for extending functionality of an FPGA according to aspects of the invention. As shown in a block 910, the method involves identifying a need for additional functionality within a first FPGA. Then, as shown in a block 920, the method also involves employing a first virtual extender plugin of the first FPGA that corresponds to the additional functionality to perform interfacing with a second virtual extender plugin of a second FPGA that includes the additional functionality. Then, as shown in a block 930, the method involves operating from the first FPGA to access the additional functionality of the second FPGA via the interface supported by the first virtual extender plugin and the second virtual extender plugin to support operation of the first FPGA. This method shows an approach by which the available functionality of a second FPGA may be used by a first FPGA that may have a deficiency, in that, that particular functionality would make the operation of the first FPGA more efficient or better.

It is also noted that the methods described within the preceding figures may also be performed within any of the appropriate system and/or apparatus designs that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A Programmable Logic Device (PLD)) that comprises:
    embedded functionality that is operable to perform processing according to a functionality format;
    a virtual extender plugin that is communicatively coupled to the embedded processor functionality via an on on-chip bus;
    wherein the virtual extender plugin is operable to transform functionality format of the embedded functionality to a serial format and vice versa; and
    wherein the virtual extender plugin is operable to transmit the serial formatted data via a high speed serial line communicatively coupled to the PLD.

2. The PLD of claim 1, wherein:
    the PLD is communicatively coupled to at least one additional PLD via the high speed serial line.

3. The PLD of claim 1, wherein:
    the virtual extender plugin operates as at least one of a virtual bus extender, a virtual memory extender, a virtual CLB (configurable logic block) extender, and a virtual LUT (Look-Up Table) extender.

4. The PLD of claim 1, wherein:
    the virtual extender plugin operates as a virtual debug extender; and
    the virtual extender plugin provides access to at least one node within the PLD via the high speed serial line communicatively coupled to the PLD.

5. The PLD of claim 1, wherein:
    the PLD communicatively couples to at least one additional PLD via the high speed serial line;
    the at least one additional PLD includes at least one additional embedded functionality having at least one additional functionality format; and
    the at least one additional PLD includes at least one additional virtual extender plugin that is operable to transform functionality format of the at least one additional embedded functionality to a serial format and vice versa.

6. The PLD of claim 1, wherein:
    the embedded functionality is an embedded microprocessor integrated circuit;
    the functionality format is a data bus format;
    the virtual extender plugin is implemented as a first VBE (Virtual Bus Extender) plugin;
    the virtual extender plugin is operable to transform the data bus format corresponding to the embedded microprocessor integrated circuit to a serial format and vice versa;
    the PLD communicatively couples to at least one additional PLD via the high speed serial line;
    the at least one additional PLD includes a peripheral functional block to support processing operations of the embedded microprocessor integrated circuit;
    the at least one additional PLD includes at least one additional virtual extender plugin;
    the at least one additional virtual extender plugin is implemented as a second VBE plugin;
    the at least one additional virtual extender plugin is operable to transform the data bus format corresponding to the embedded microprocessor integrated circuit to a serial format and vice versa; and
    the embedded microprocessor integrated circuit accesses the at least one additional peripheral functional block of the at least one additional PLD to support the operation of the embedded microprocessor integrated circuit.

7. The PLD of claim 1, wherein:
    the PLD communicatively couples to at least one additional PLD via the high speed serial line; and
    the high speed serial line is implemented using at least one of a PCB (Printer Circuit Board) interconnect, a backplane, and a line card.

8. The PLD of claim 1, wherein:
    the embedded functionality includes an embedded microprocessor integrated circuit;
    the PLD includes a peripheral functional block, communicatively coupled to the embedded microprocessor integrated circuit via an OPB (On-chip Peripheral Bus), to support processing operations of the embedded microprocessor integrated circuit;
    the PLD includes block memory that can support the operation of the embedded microprocessor integrated circuit;
    the PLD includes a plurality of LUTs (Look Up Tables) that is implemented as reconfigurable circuitry operable to support logic functional processing; and
    the PLD is implemented as an integrated circuit that includes each of the embedded microprocessor integrated circuit, the block memory, and the plurality of LUTs.

9. The PLD of claim 1, wherein:
    the PLD is implemented as a first integrated circuit;
    at least one additional PLD is implemented as a second integrated circuit;
    the first integrated circuit communicatively couples to the second integrated circuit via the high speed serial line; and
    the high speed serial line is implemented using a PCB (Printer Circuit Board) interconnect.

10. The PLD of claim 1, wherein:
    the virtual extender plugin includes an encoder that performs appropriate formatting of input information when transforming the functionality format of the embedded functionality to the serial format;
    the virtual extender plugin includes a decoder that performs appropriate formatting of received information when transforming the received information from the serial format to the functionality format of the embedded functionality;
    the encoder adds a SOF (Start of Frame) code, an XD (delimiter), and an EOF (End of Frame) code to the input information when transforming the functionality format of the embedded functionality to the serial format; and the decoder removes a SOF code, an XD, and an EOF code from the received information when transforming the received information from the serial format to the functionality format of the embedded functionality.

11. The PLD of claim 10, wherein:
at least one of the SOF code, the XD, and the EOF code that is added to the input information and the SOF code, the XD, and the EOF code that is removed from the received information is dynamically modified.

12. An FPGA (Field Programmable Gate Array) that comprises:
an embedded microprocessor integrated circuit;
a peripheral functional block, communicatively coupled to the embedded microprocessor integrated circuit via an OPB (On-chip Peripheral Bus), that is operable to support processing operations of the embedded microprocessor integrated circuit
a VBE (Virtual Bus Extender) plugin, communicatively coupled to the embedded microprocessor integrated circuit; via the OPB, that is operable to transform a data bus format corresponding to the embedded microprocessor integrated circuit to a serial format and vice versa; and
wherein the VBE plugin is operable to transmit the serial formatted data via a high speed serial line communicatively coupled to the FPGA.

13. The FPGA of claim 12, wherein:
the FPGA is implemented as a first integrated circuit;
at least one additional FPGA is implemented as a second integrated circuit;
the first integrated circuit communicatively couples to the second integrated circuit via the high speed serial line; and
the high speed serial line is implemented using a PCB (Printer Circuit Board) interconnect.

14. The FPGA of claim 12, wherein:
the FPGA communicatively couples to at least one additional FPGA via the high speed serial line; and
the high speed serial line is implemented using at least one of a PCB (Printer Circuit Board) interconnect, a backplane, and a line card.

15. The FPGA of claim 12, wherein:
the VBE plugin includes a MGT (Multi-Gigabit Transceiver) that includes a high speed serializer and a high speed de-serializer;
the high speed serializer is operable to transform the data bus format from a parallel format to the serial format;
the serial format comports with the high speed serial line communicatively coupled to the FPGA; and
the high speed de-serializer operable to transform the serial format to the data bus format having a parallel format.

16. The FPGA of claim 12, wherein:
the VBE plugin includes an encoder that performs appropriate formatting of input information when transforming the data bus format to the serial format;
the VBE plugin includes a decoder that performs appropriate formatting of received information when transforming the received information from the serial format to the data bus format;
the encoder adds a SOF (Start of Frame) code, at least one XD (delimiter), and an EOF (End of Frame) code to the input information when transforming the data bus format to the serial format; and the decoder removes a SOF code, at least one XD, and an EOF code from the received information when transforming the received information from the serial format to the data bus format.

17. The FPGA of claim 16, wherein:
at least one of the SOF code, the XD, and the EOF code that is added to the input information and the SOF code, the XD, and the EOF code that is removed from the received information is dynamically modified.

18. An FPGA that comprises:
a block memory functional block;
a VME (Virtual Memory Extender) plugin, communicatively coupled to the block memory functional block via a bus, that is operable to transform a block memory format corresponding to the block memory functional block to a serial format and vice versa; and
wherein the VME plugin is operable to transmit the serial formatted data via a high speed serial line communicatively coupled to the FPGA.

19. The FPGA of claim 18, wherein:
the FPGA is implemented as a first integrated circuit;
at least one additional FPGA is implemented as a second integrated circuit;
the first integrated circuit communicatively couples to the second integrated circuit via the high speed serial line; and
the high speed serial line is implemented using a PCB (Printer Circuit Board) interconnect.

20. The FPGA of claim 18, wherein:
the FPGA communicatively couples to at least one additional FPGA via the high speed serial line; and
the high speed serial line is implemented using at least one of a PCB (Printer Circuit Board) interconnect, a backplane, and a line card.

21. The FPGA of claim 18, wherein:
the VME plugin includes a MGT (Multi-Gigabit Transceiver) that includes a high speed serializer and a high speed de-serializer;
the high speed serializer is operable to transform the block memory format from a parallel format to the serial format;
the serial format comports with the high speed serial line communicatively coupled to the FPGA; and
the high speed de-serializer operable to transform the serial format to the block memory format having a parallel format.

22. The FPGA of claim 18, wherein:
the VME plugin includes an encoder that performs appropriate formatting of input information when transforming the block memory format to the serial format;
the VME plugin includes a decoder that performs appropriate formatting of received information when transforming the received information from the serial format to the block memory format;
the encoder adds a SOF (Start of Frame) code, at least one XD (delimiter), and an EOF (End of Frame) code to the input information when transforming the block memory format to the serial format; and
the decoder removes a SOF code, at least one XD, and an EOF code from the received information when transforming the received information from the serial format to the block memory format.

23. The FPGA of claim 22, wherein:
at least one of the SOF code, the XD, and the EOF code that is added to the input information and the SOF code, the XD, and the EOF code that is removed from the received information is dynamically modified.

24. A system for extending a resource of a first integrated circuit (IC) comprising:
a first virtual extender plug-in having a first multi-gigabit transceiver, the first virtual extender plug-in formed in the first IC and coupled to the first IC resource;
a second virtual extender plug-in having a second multi-gigabit transceiver, the second virtual extender plug-in formed in the second IC and coupled to a second IC resource; and
a communication link connecting the first multi-gigabit transceiver to the second multi-gigabit transceiver; and
wherein the first IC resource is selected from a group comprising: embedded processing functionality, block memory, and a configurable logic block.

25. The system of claim 24 wherein the second IC resource is selected from a group comprising: embedded processing functionality, block memory, and a configurable logic block.

26. The system of claim 24 wherein the first and second ICs are PLDs.

27. An FPGA (Filed Programmable Logic Array) that comprises:
a plurality of LUTs (Look Up Tables);
a VLE (Virtual Look-Up Table Extender) plugin, communicatively coupled to the plurality of LUTs via input and output signals, that is operable to transform a LUT format corresponding to the plurality of LUTs to a serial format and vice versa; and
wherein the VLE plugin is operable to transmit the serial formatted data via a high speed serial line communicatively coupled to the FPGA.

28. The FPGA of claim 27, wherein:
the FPGA is implemented as a first integrated circuit;
at least one additional FPGA is implemented as a second integrated circuit;
the first integrated circuit communicatively couples to the second integrated circuit via the high speed serial line; and
the high speed serial line is implemented using a PCB (Printer Circuit Board) interconnect.

29. The FPGA of claim 27, wherein:
the FPGA communicatively couples to at least one additional FPGA via the high speed serial line; and
the high speed serial line is implemented using at least one of a PCB (Printer Circuit Board) interconnect, a backplane, and a line card.

30. The FPGA of claim 27, wherein:
the VLE plugin includes a MGT (Multi-Gigabit Transceiver) that includes a high speed serializer and a high speed de-serializer;
the high speed serializer is operable to transform the LUT format from a parallel format to the serial format;
the serial format comports with the high speed serial line communicatively coupled to the FPGA; and
the high speed de-serializer operable to transform the serial format to the LUT format having a parallel format.

31. The FPGA of claim 27, wherein:
the VLE plugin includes an encoder that performs appropriate formatting of input information when transforming the LUT format to the serial format;
the VLE plugin includes a decoder that performs appropriate formatting of received information when transforming the received information from the serial format to the LUT format;
the encoder adds a SOF (Start of Frame) code, at least one XD (delimiter), and an EOF (End of Frame) code to the input information when transforming the LUT format to the serial format; and
the decoder removes a SOF code, at least one XD, and an EOF code from the received information when transforming the received information from the serial format to the LUT format.

32. The FPGA of claim 31, wherein:
at least one of the SOF code, the XD, and the EOF code that is added to the input information and the SOF code, the XD, and the EOF code that is removed from the received information is dynamically modified.

33. A method for extending functionality of an FPGA (Filed Programmable Logic Array), the method comprising:
identifying a need for additional functionality within a first FPGA;
employing a first virtual extender plugin of the first FPGA that corresponds to the additional functionality to perform interfacing with a second virtual extender plugin of a second FPGA that includes the additional functionality; and
from the first FPGA, accessing the additional functionality of the second FPGA via the interface supported by the first virtual extender plugin and the second virtual extender plugin to support operation of the first FPGA.

34. The method of claim 33, wherein:
the first FPGA is implemented as a first integrated circuit;
at second FPGA is implemented as a second integrated circuit;
the first integrated circuit communicatively couples to the second integrated circuit via a high speed serial line; and
the high speed serial line is implemented using a PCB (Printer Circuit Board) interconnect.

35. The method of claim 33, wherein:
the first FPGA communicatively couples to the second FPGA via a high speed serial line; and
the high speed serial line is implemented using at least one of a PCB (Printer Circuit Board) interconnect, a backplane, and a line card.

36. The method of claim 33, wherein:
at least one of the first virtual extender plugin and the second virtual extender plugin includes a MGT (Multi-Gigabit Transceiver) that includes a high speed serializer and a high speed de-serializer;
the high speed serializer is operable to transform the additional functionality format from a parallel format to a serial format;
the serial format comports with a high speed serial line that communicatively couples the first FPGA to the second FPGA; and
the high speed de-serializer operable to transform the serial format to the additional functionality format having a parallel format.

37. The method of claim 33, wherein:
at least one of the first virtual extender plugin and the second virtual extender plugin includes an encoder that performs appropriate formatting of input information when transforming the additional functionality format from a parallel format to a serial format;
at least one of the first virtual extender plugin and the second virtual extender plugin includes a decoder that performs appropriate formatting of received information when transforming the received information from the serial format to the additional functionality format;

the encoder adds a SOF (Start of Frame) code, at least one XD (delimiter), and an EOF (End of Frame) code to the input information when transforming the additional functionality format to the serial format; and the decoder removes a SOF code, at least one XD, and an EOF code from the received information when transforming the received information from the serial format to the additional functionality format.

38. The method of claim 37, further comprising:

dynamically modifying at least one of the SOF code, the XD, and the EOF code that is added to the input information and the SOF code, the XD, and the EOF code that is removed from the received information.

* * * * *